United States Patent
Qian

[11] Patent Number: 5,923,981
[45] Date of Patent: Jul. 13, 1999

[54] CASCADING TRANSISTOR GATE AND METHOD FOR FABRICATING THE SAME

[75] Inventor: Qi-De Qian, Santa Clara, Calif.

[73] Assignee: Intel Corporation, Santa Clara, Calif.

[21] Appl. No.: 08/777,600

[22] Filed: Dec. 31, 1996

[51] Int. Cl.[6] .................................................. H01L 21/336
[52] U.S. Cl. ......................... 438/284; 438/197; 438/301; 438/585; 438/947
[58] Field of Search ..................... 438/176, 177, 438/183, 283, 284, 299, 578, 585, 945, 947, 197, 301

[56] References Cited

U.S. PATENT DOCUMENTS

| | | |
|---|---|---|
| 4,287,660 | 9/1981 | Nicholas . |
| 4,312,680 | 1/1982 | Hsu . |
| 4,402,128 | 9/1983 | Blackstone . |
| 4,419,809 | 12/1983 | Riseman et al. . |
| 4,460,413 | 7/1984 | Hirata et al. ............................. 438/297 |
| 4,729,966 | 3/1988 | Koshino et al. . |
| 4,803,181 | 2/1989 | Buchmann et al. . |
| 4,851,365 | 7/1989 | Jeuch . |
| 4,931,137 | 6/1990 | Sibuet . |
| 5,040,035 | 8/1991 | Gabara et al. ........................... 438/279 |
| 5,198,691 | 3/1993 | Tarng ....................................... 257/316 |
| 5,202,272 | 4/1993 | Hsieh et al. . |
| 5,236,853 | 8/1993 | Hsue ........................................ 438/587 |
| 5,306,932 | 4/1994 | Miwada ................................... 257/239 |
| 5,443,999 | 8/1995 | Uenishi et al. ............................. 437/6 |
| 5,528,056 | 6/1996 | Shimada et al. .......................... 257/72 |
| 5,599,738 | 2/1997 | Hashemi et al. . |
| 5,682,054 | 10/1997 | Nakashima ............................... 257/401 |
| 5,705,414 | 1/1998 | Lustig ...................................... 438/585 |
| 5,710,066 | 1/1998 | Okamoto et al. ........................ 438/947 |

OTHER PUBLICATIONS

Fiegna et al, "Scaling the MOS Transistor Below 0.1 um: Methodology, Device Structures, and Technology Requirements", TED Jun. 1995, p. 941.

Kimura et al, "Short–Channel–Effect–Supressed Sub 0.1 um Grooved–Gate MOSFET's with W Gate", TED Jan. 1995, p. 94.

J. T. Jhorstmann et al, "Characterizatin of Sub–100 nm–MOS Transistors Fabricated by Optical Lithographer and a Sidewall–Etchback Process" NME, Sep. 1995.

*Primary Examiner*—Peter Toby Brown
*Assistant Examiner*—Toniae M. Thomas
*Attorney, Agent, or Firm*—Calvin E. Wells

[57] ABSTRACT

A cascading transistor gate structure and method for fabricating the same are disclosed. A substrate is provided, and a layer of gate dielectric material is formed over the substrate. A layer of electrically conductive material is formed over the gate dielectric. A layer of hard mask material is formed on the layer of electrically conductive material. A photoresist mask is used to pattern the layer of hard mask material to form a hard mask. A layer of spacer material is deposited over the existing structures, and the layer of spacer material is etched to form a pair of spacers adjacent to the hard mask. The hard mask is removed, leaving the spacers. The layer of electrically conductive material is etched in alignment with the spacers. The spacers are then removed, revealing two transistor gates. A conductive region in formed in the substrate between the two gates. The two gates operate in tandem, yielding a cascading gate with an effective length that is the lengths of the two gates combined.

14 Claims, 16 Drawing Sheets

CASCADING TRANSISTOR GATE AND
METHOD FOR FABRICATING THE SAME

BACKGROUND OF THE INVENTION

1. Field of the Invention

The present invention pertains to the field of semiconductor processing. More particularly, this invention relates to the formation of the transistor gate.

2. Background of the Related Art

Metal oxide semiconductor (MOS) technology is used to form a number of different types of devices including memory devices and microprocessors. The basic device structure forming the field effect transistor (FET) comprises an insulated gate electrically overlaying a channel region between a source and drain. The gate is an electrically conductive material separated a small distance from the underlying silicon substrate via a thin insulating layer usually made of silicon oxide. The source and drain are formed in the silicon substrate by introducing dopants in controlled amounts to make the source and drain n-type or p-type relative to the surrounding silicon. The dopants for the source and drain are inserted into the silicon using diffusion or ion implantation, both processes which require subjecting the substrate to high temperatures.

Early transistor structures were formed by first diffusing dopants into the source and drain regions and afterward forming the gate. The formation of the gate was done by depositing gate material and subsequently doing conventional photolithography patterning. Because of the need to ensure that the gate overlay the entire channel region and limitations in manufacturing tolerances, high volume manufacturing required a significant gate overlap into the source and drain to ensure that the gate adequately covered the entire channel region. For smaller device sizes the gate overlap led to significant parasitic capacitance between the gate and source region and the gate and drain region. A self-aligning manufacturing process was then developed whereby the gate itself would serve as a mask for forming the source and drain. The gate had to be formed first, so that the source and drain could be formed in alignment with the gate. A consequence of the self-aligned process was that the gate material had to be changed from metal to silicon because of the requirement that the gate withstand the high temperature processing for forming the source and drain.

In an effort to achieve smaller than 100 nm gate lengths, a process was developed whereby conventional photolithography is used to define edges onto which the dimensions of the future gate is established. This process is referred to as "litho-less". The litho-less process provides for greater critical dimension control and allows for the formation of very small devices, which in turn provides greater device performance. An example of this process is shown in FIGS. 1a–1k. FIG. 1a shows a silicon substrate 130. A layer of gate dielectric 120, comprising silicon oxide, is formed on the substrate 130. A layer of polycrystalline silicon (polysilicon) 110 is formed on the gate dielectric 120. In FIG. 1b, a layer of sacrificial oxide 140 is shown formed on the layer of polysilicon 110. The layer of sacrificial oxide 140 is patterned using a first mask 145 shown in FIG. 1c. The resulting intermediate structure showing the patterned sacrificial oxide 140 is depicted in FIG. 1d. A layer of silicon nitride 150 is formed, as shown in FIG. 1e. FIG. 1f discloses that the silicon nitride 150 is etched to create spacers 153 and 155. The sacrificial oxide 140 is removed, leaving spacers 153 and 155, as depicted in FIG. 1g. Next, a second mask is used to protect spacer 153 while spacer 155 is removed. The resulting intermediate structure is shown in FIG. 1i. FIG. 1j shows that the exposed portion of the polysilicon 110 is removed. FIG. 1k indicates that the nitride spacer 153 is removed, exposing the remaining polysilicon, thus forming the transistor gate. The remainder of the transistor structure is formed using standard CMOS process.

The above litho-less process for creating a transistor gate has the drawback of requiring a specialized mask set. In particular, the above process has the problem of requiring an extra mask step to strip away unwanted spacer, as discussed above and depicted in FIG. 1h. Thus, a method for fabricating a transistor gate using a litho-less process that can be accomplished with the use of a standard mask set is desirable.

SUMMARY OF THE INVENTION

A cascading transistor gate and a method for fabricating the same are disclosed. A dielectric layer is formed on a substrate. A first gate and a second gate are formed on the dielectric layer, and a conductive region is formed in the substrate between the first and second gates.

BRIEF DESCRIPTION OF THE DRAWINGS

FIG. 2a-2 is a side-view depiction of a substrate, gate dielectric, and electrically conductive material implemented in accordance with the present invention.

FIG. 2a-3 is a side-view depiction of a substrate, isolation trenches, gate dielectric, and electrically conductive material implemented in accordance with the present invention.

FIG. 2b-1 is a top-view depiction of a layer of hard mask material implemented in accordance with the teachings of the present invention.

FIG. 2b-2 is a side-view depiction of a layer of hard mask material formed on the layer of electrically conductive material in accordance with the teachings of the present invention.

FIG. 2c-1 is a top-view depiction of a photoresist mask formed on the layer of hard mask material in accordance with the teachings of the present invention.

FIG. 2c-2 is a side-view depiction of a photoresist mask formed on the layer of hard mask material in accordance with the teachings of the present invention.

FIG. 2d-1 is a top-view depiction of the patterned hard mask material on the layer of electrically conductive material implemented in accordance with the present invention.

FIG. 2d-2 is a side-view depiction of the patterned hard mask material on the layer of electrically conductive material implemented in accordance with the present invention.

FIG. 2f-1 is a top-view depiction of the layer of spacer material having been anisotropically etched in accordance with the teachings of the present invention.

FIG. 2f-2 is a side-view depiction of the layer of spacer material having been anisotropically etched in accordance with the teachings of the present invention.

FIG. 2g-1 is a top-view depiction of the hard mask having been removed in accordance with the teachings of the present invention.

FIG. 2g-2 is a side-view depiction of the hard mask having been removed in accordance with the teachings of the present invention.

FIG. 2h-1 is a top-view depiction of the layer of electrically conductive material having been etched in accordance with the teachings of the present invention.

FIG. 2h-2 is a side-view depiction of the layer of electrically conductive material having been etched in accordance with the teachings of the present invention.

FIG. 2i-1 is a top-view depiction of the spacers having been removed in accordance with the teachings of the present invention.

FIG. 2i-2 is a side-view depiction of the spacers having been removed in accordance with the teachings of the present invention.

FIG. 2j-1 is a top-view depiction of a completed cascading gate structure implemented in accordance with the teachings of the present invention.

FIG. 2j-2 is a side-view depiction of a completed cascading gate structure implemented in accordance with the teachings of the present invention.

FIG. 3a-1 is a top-view depiction of a photoresist mask formed on a layer of hard mask material in accordance with the teachings of the present invention.

FIG. 3a-2 is a side-view depiction of a photoresist mask formed on a layer of hard mask material in accordance with the teachings of the present invention.

FIG. 3b-1 is a top-view depiction of the patterned hard mask material on the layer of electrically conductive material implemented in accordance with the present invention.

FIG. 3b-2 is a side-view depiction of the patterned hard mask material on the layer of electrically conductive material implemented in accordance with the present invention.

FIG. 3d-1 is a top-view depiction of the layer of spacer material having been anisotropically etched in accordance with the teachings of the present invention.

FIG. 3d-2 is a side-view depiction of the layer of spacer material having been anisotropically etched in accordance with the teachings of the present invention.

DETAILED DESCRIPTION

A cascading transistor gate and a method for fabricating the same using a litho-less process is disclosed. In the following description, for the purposes of explanation, specific details are set forth to provide a thorough understanding of the present invention. However, it will be obvious to one skilled in the art that these specific details are not required to practice the present invention. In other instances, well known structures and processes are not described in particular detail in order to avoid obscuring the present invention.

The present invention solves the problem of needing a specialized mask to remove unwanted spacer during the formation of transistor gates using a litho-less process. In the present invention, a pair of gates with sub-lithographic lengths are used to replace a longer conventional gate. Sub-lithographic gate lengths are those lengths which are not achievable using a conventional lithographic process. The process of the present invention requires only two mask steps. The first step uses the existing conventional polysilicon mask to form the cascading gate structures and the second step uses the conventional polysilicon mask without the smallest gate pattern to form larger structures and polysilicon gate contacts. The use of these simple patterns ensures the applicability of this method to random logic circuits. Thus, the present invention provides the critical dimension control and device performance benefits of the litho-less process without requiring the use of a specialized mask set. Automatic pattern conversion from a conventional polysilicon mask to a specialized litho-less mask set has not yet been demonstrated.

The present invention may also be used to ease the "hidden gap" problem. The cascading gate structure of the present invention has an effective gate length of approximately twice that of a gate produced using the litho-less process discussed above. Thus, the present invention provides an effective gate length that is larger than the minimum size gate provided by the litho-less process and is much smaller than that achievable through photolithography.

In general, in accordance with an embodiment of the present invention, a gate dielectric layer is formed on a substrate. A first gate is formed on the dielectric layer, and a second gate is also formed on the dielectric layer. A conductive region is then formed in the substrate between the first and second gates. The first and second gates operate in tandem as a single gate with an effective gate length that is the combined gate lengths of the first and second gates.

Figure 1A:
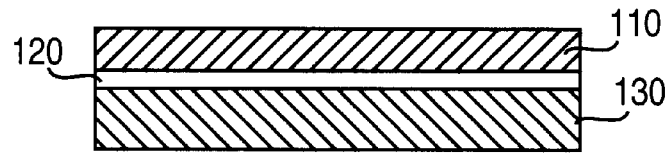
FIG. 1a is a side-view depiction of a silicon substrate, gate oxide, and polysilicon layer implemented in accordance with the related art.
Figure 1B:
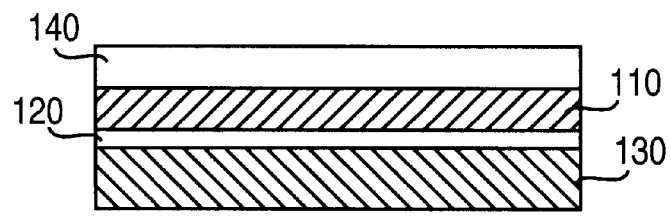
FIG. 1b is a side-view depiction of a layer of silicon oxide formed on the polysilicon layer in accordance with the teachings of the related art.
Figure 1C:
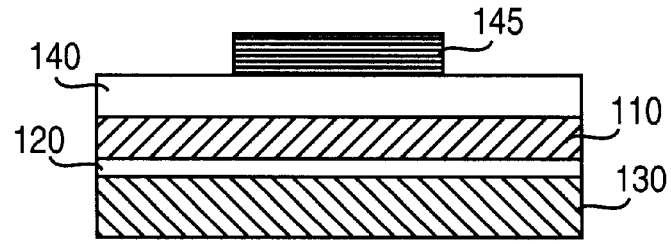
FIG. 1c is a side-view depiction of a photoresist mask formed on the layer of silicon oxide in accordance with the teachings of the related art.
Figure 1D:
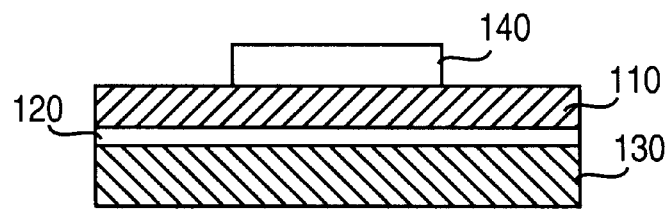
FIG. 1d is a side-view depiction of the patterned silicon oxide on the polysilicon layer implemented in accordance with the related art.
Figure 1E:
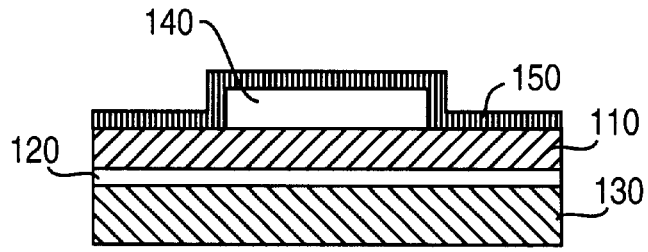
FIG. 1e is a side-view depiction of a layer of silicon nitride conformally deposited over the previously existing structures in accordance with the teachings of the related art.
Figure 1F:
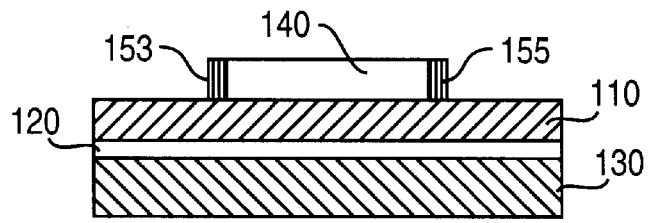
FIG. 1f is a side-view depiction of the silicon nitride layer having been anisotropically etched in accordance with the teachings of the related art.
Figure 1G:
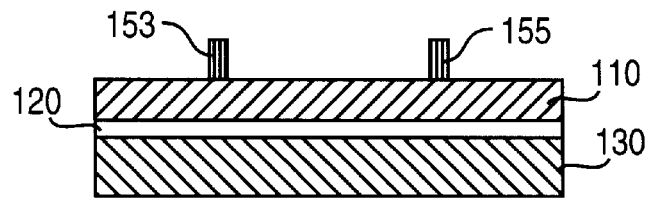
FIG. 1g is a side-view depiction of the silicon oxide having been removed in accordance with the teachings of the related art.
Figure 1H:
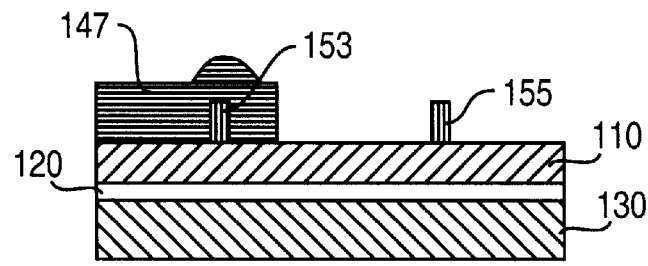
FIG. 1h is a side view depiction of a photoresist mask used to protect a spacer in accordance with the teachings of the related art.
Figure 1I:
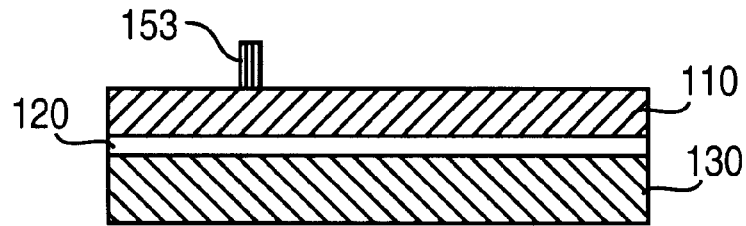
FIG. 1i is a side view depiction of one spacer having been removed in accordance with the teachings of the related art.
Figure 1J:
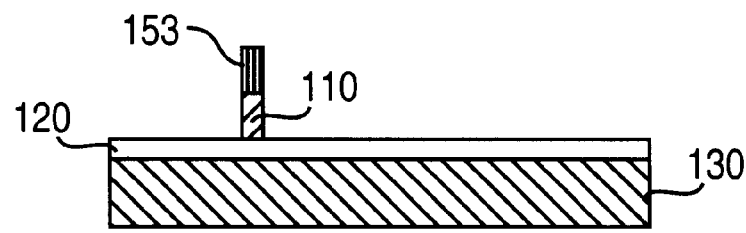
FIG. 1j is a side-view depiction of the polysilicon having been etched in accordance with the teachings of the related art.
Figure 1K:
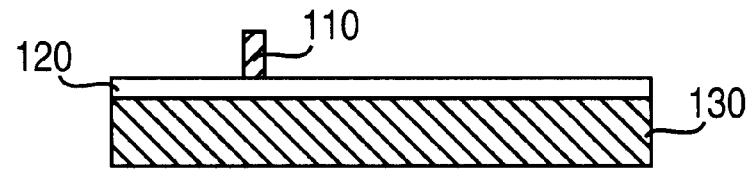
FIG. 1k is a side-view depiction of the gate structure implemented in accordance with the teachings of the related art.
Figures 1, 2A:
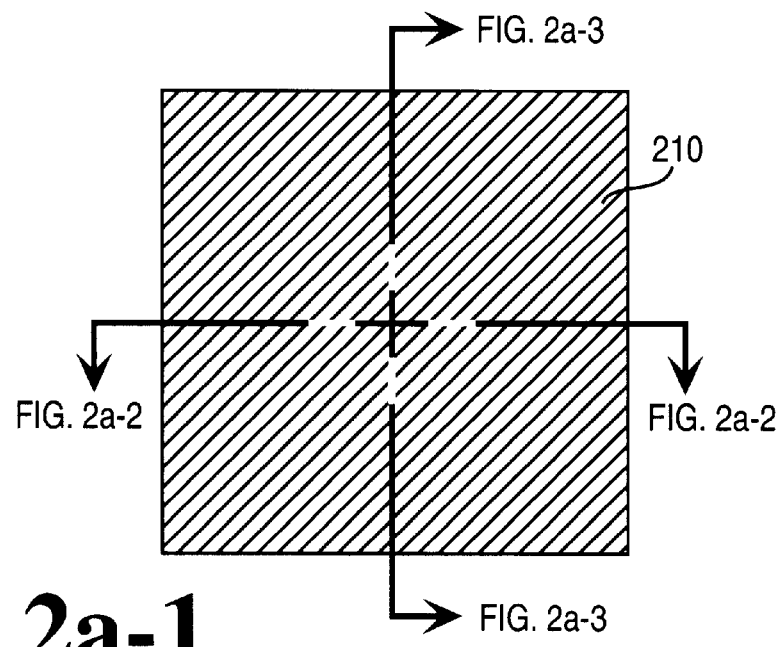
FIG. 2a-1 is a top-view depiction of a layer of electrically conductive material implemented in accordance with the teachings of the present invention.
Figures 2, 2A:
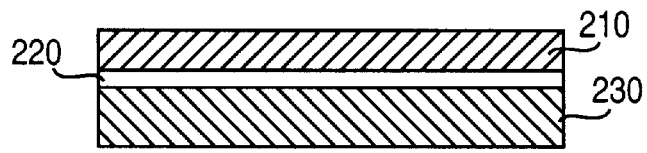
Figures 2, 2A, 3:
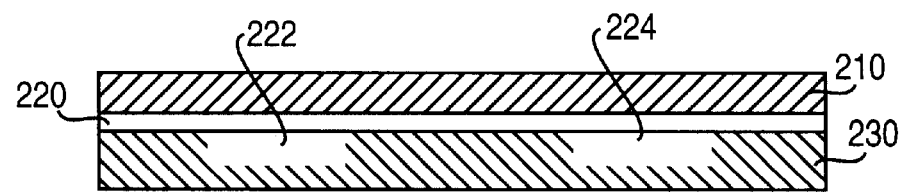

FIGS. 2*a*-1 through 2*j*-2 depict a method for fabricating a cascading transistor gate implemented in accordance with the teachings of the present invention. FIG. 2*a*-1 shows a top view of a layer of electrically conductive material 210. In the present example, the layer of electrically conductive material 210 comprises polysilicon. The polysilicon layer 210 is formed over a layer of gate dielectric 220, which is formed over a substrate 230. The layer of polysilicon is preferably formed by a blanket deposition (that is, polysilicon is deposited onto all surfaces) to a thickness of between 1000–3500 Å. The substrate 230, gate dielectric 220, and polysilicon 210 are shown in the cross-sectional views depicted in FIGS. 2*a*-2 and 2*a*-3. In the present example, the substrate 230 comprises silicon. Silicon formed on other substrates such as silicon oxide, aluminum oxide, or glass, on which integrated circuits can be built, can be used. The gate dielectric 220 comprises silicon dioxide in the present example. Other possible gate dielectric materials include lead strontium, barium strontium, aluminum oxide, and tantalum pentoxide. A layer of nitrided oxide may also be used. The gate dielectric layer is preferably deposited to a thickness of between 20–50 angstroms (Å). FIG. 2*a*-3 shows that isolation trenches 222 and 224 have been formed in the substrate 230. The isolation trenches 222 and 224 are formed by etching trenches in the substrate 230 and filling the trenches with a dielectric, preferably silicon dioxide for the present example. Isolation trenches in general are used to isolate wells of different conductivity types and to isolate adjacent transistors. Other isolation methods can be used such as, but not limited to, LOCOS, recessed LOCOS, or silicon on insulator (SOI), and suitable insulators, other than oxides, such as nitrides may be used if desired.

Figures 1, 2B:
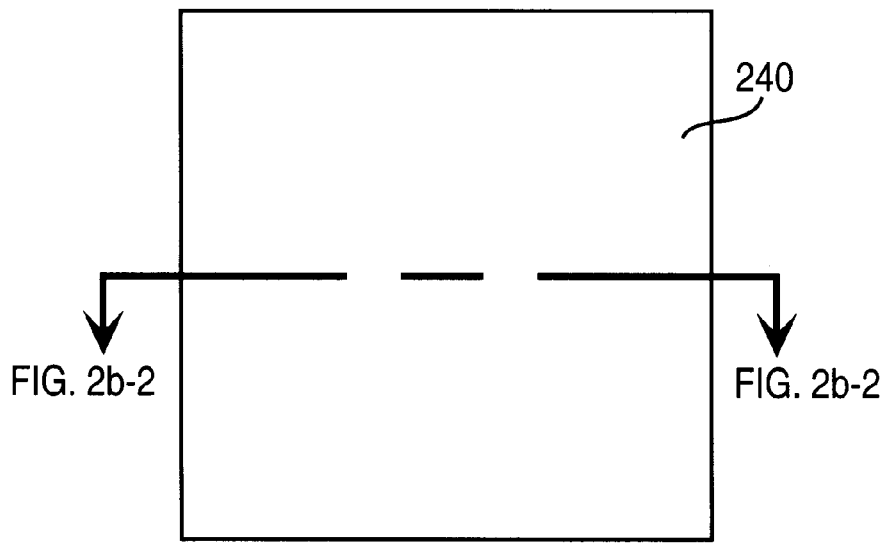
Figures 2, 2B:
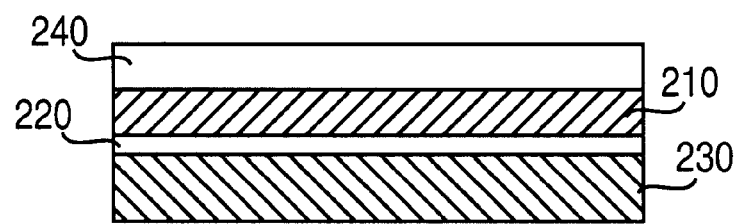

In FIGS. 2*b*-1 and 2*b*-2, a layer of hard mask material 240 is formed over the polysilicon 210. The preferred hard mask material in this example is silicon dioxide, formed by blanket deposition to a thickness of 1800 Å. Other thicknesses are possible. The hard mask material can be any material that can withstand high temperature processing and can be etched.

Figures 1, 2C:
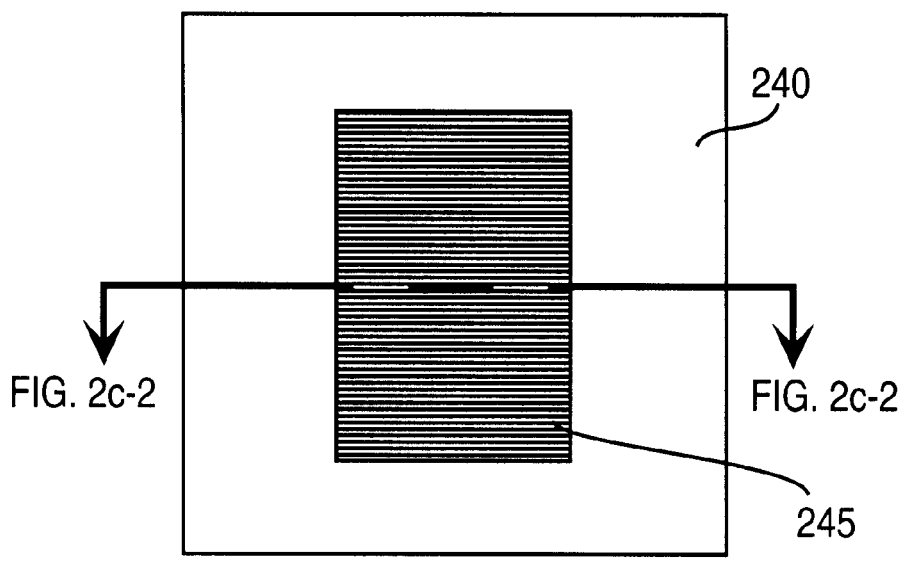
Figures 2, 2C:
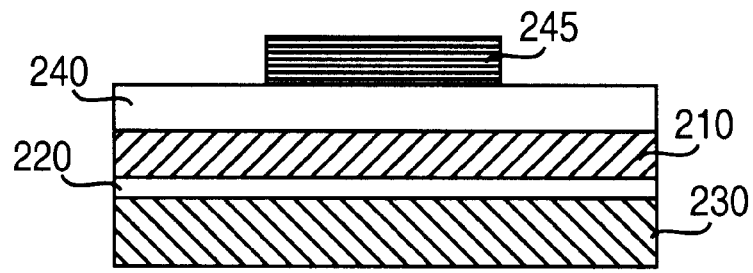
Figures 1, 2D:
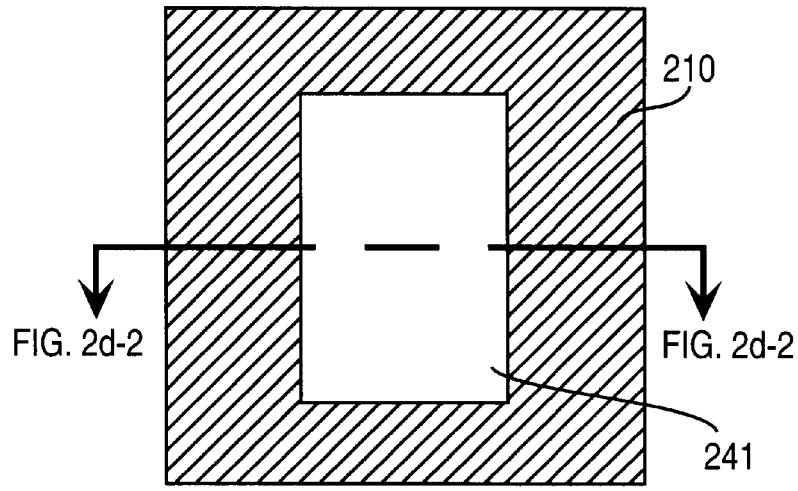
Figures 2, 2D:
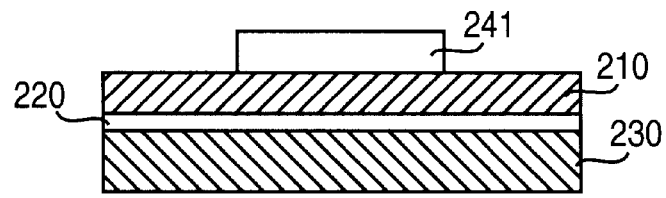

The hard mask material 240 is typically patterned using a known photoresist lithography and plasma etching process. FIGS. 2*c*-1 and 2*c*-2 show a photoresist mask 245. The photoresist mask 245 is used to form a hard mask 241, as depicted in FIGS. 2*d*-1 and 2*d*-2. It is adjacent to side walls of the hard mask 241 that the future gate hard masks will be formed, as discussed below. Therefore, it is the patterning of the hard mask material 240 that determines the location of the future gate structures. The patterning of the hard mask material 240 will also determine the length of the conductive region that will be formed in the substrate, as discussed below.

Figure 2E:
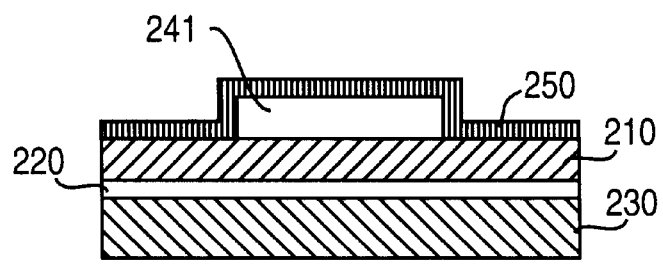
FIG. 2e is a side-view depiction of a layer of spacer material conformally deposited over the previously existing structures in accordance with the teachings of the present invention.

Next, a layer of spacer material 250 is formed, as shown in FIG. 2*e*. The spacer material 250 is selected to be one that can withstand high temperature processing and can be selectively etched with respect to the hard mask 241. The preferred spacer material in this example is silicon nitride. The silicon nitride 250 is blanket deposited, preferably using chemical vapor deposition. The silicon nitride is deposited conformally so that the deposited silicon nitride 250 is approximately the same thickness on the vertical surfaces as on the horizontal surfaces. The thickness of the deposited silicon nitride 250 will determine the length of the future gate structures, and thus the effective length of the future cascading gate structure. Preferably, the thickness of the deposited silicon nitride 250 is 1000 Å or more. Smaller thicknesses are also possible.

Figures 1, 2F:
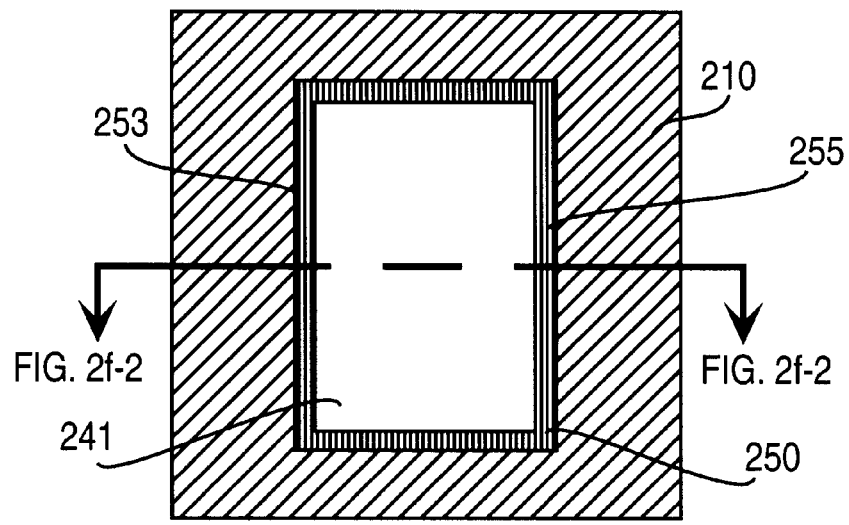
Figures 2, 2F:
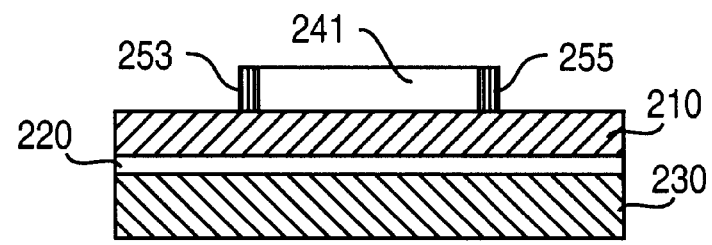

After the deposition of the spacer material 250, the spacer material 250 is anisotropically etched. The etching is preferably accomplished using a reactive ion etching (RIE) process. By etching anisotropically, the spacer material will be completely removed form the horizontal surfaces and a portion adjacent to each vertical edge of the hard mask 241 will remain to create spacers 253 and 255, as shown in FIG. 2*f*-2. FIG. 2*f*-1 shows a top view illustrating the hard mask 241 located between nitride spacers 253 and 255. FIG. 2*f*-1 also shows the remaining spacer material 250 and the underlying polysilicon layer 210.

Figures 1, 2G:
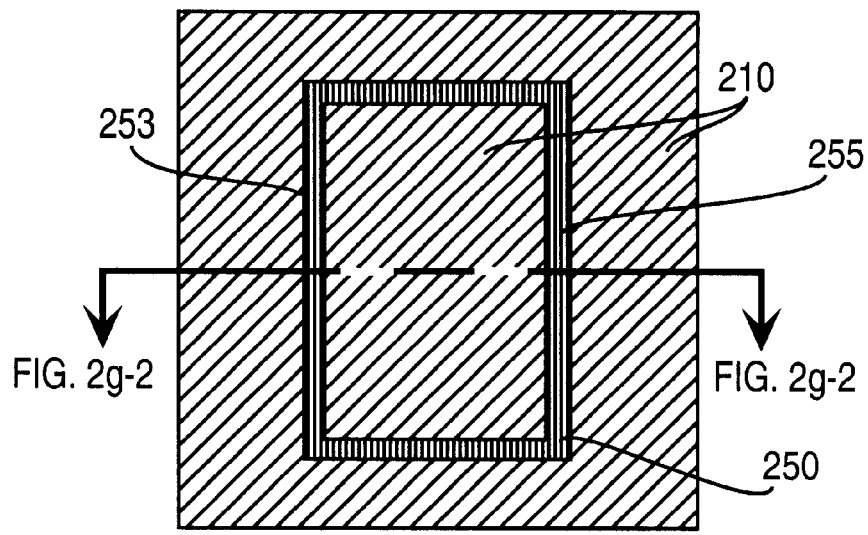
Figures 2, 2G:
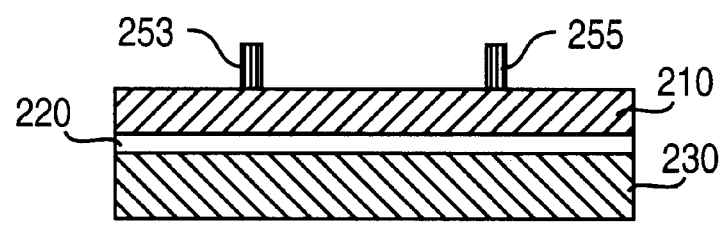

Next, the hard mask 241 is removed, as shown in FIGS. 2*g*-1 and 2*g*-2. Because the spacer material 250 is chosen to be selectively removable with respect to the hard mask 241, spacers 253 and 255 are not affected when the hard mask 241 is removed. Spacers 253 and 255 will serve as hard masks for the formation of the future gates.

Figures 1, 2H:
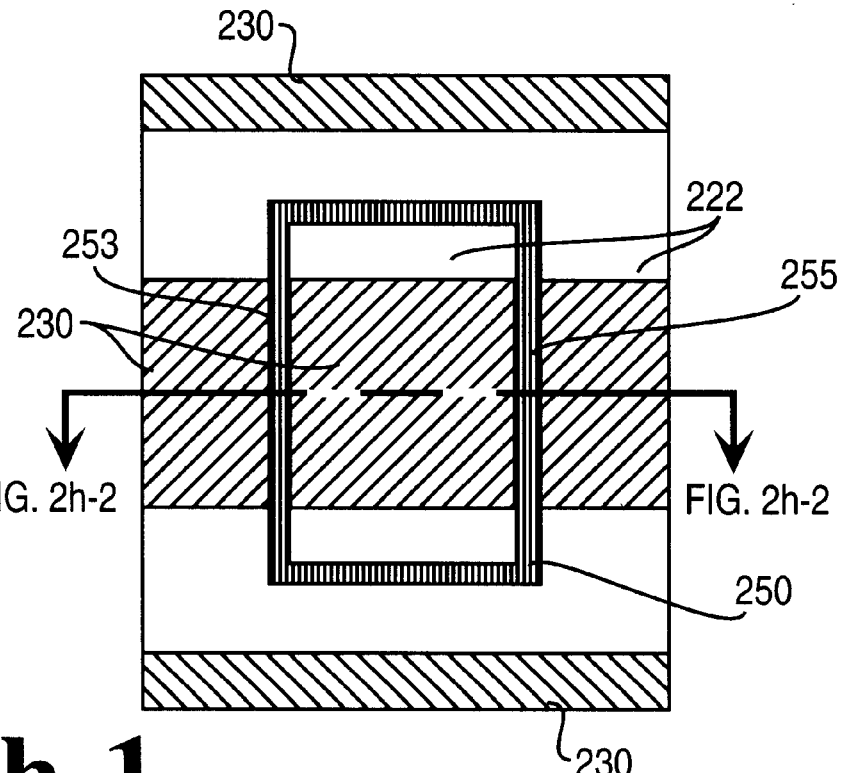
Figures 2, 2H:
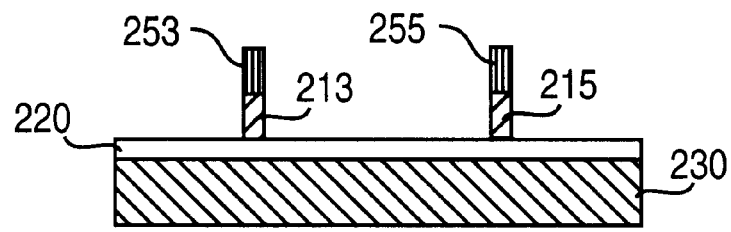

After the hard mask 241 is removed, the portions of the polysilicon layer 210 that are not masked by spacers 253 and 255 or by the remaining spacer material 250 are removed. The resulting intermediate structures are depicted in FIGS. 2*h*-1 and 2*h*-2. In FIG. 2*h*-1, the gate dielectric layer 220 is not shown in order to reveal the underlying isolation trenches 222 and 224, as well as the silicon substrate 230. FIG. 2*h*-2 shows clearly that the thickness of the nitride spacers 253 and 255 determine the length of the newly formed polysilicon gates 213 and 215.

Figures 1, 2I:
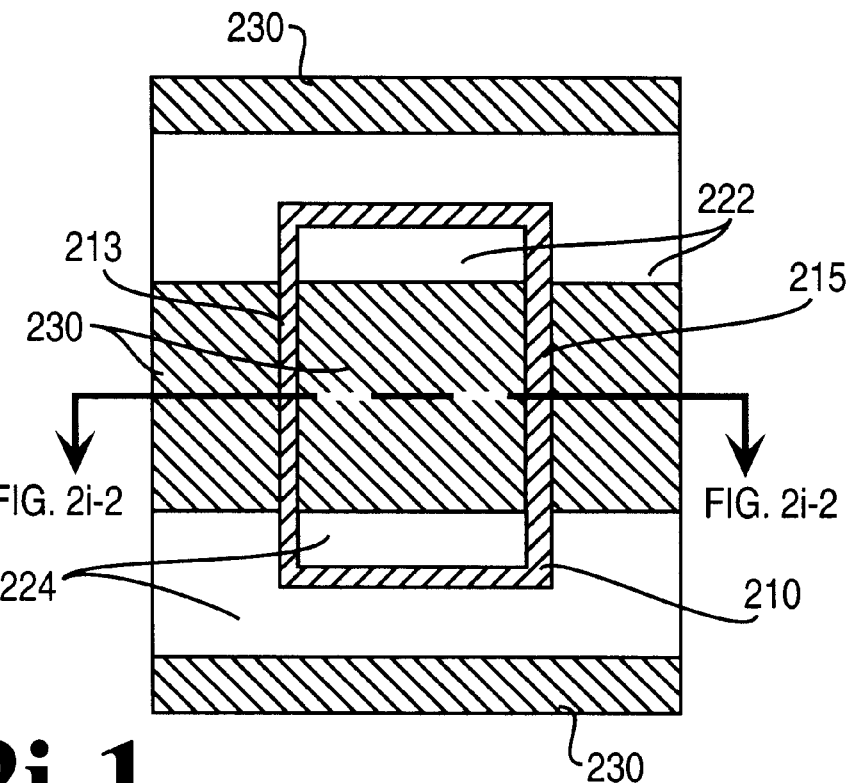
Figures 2, 2I:
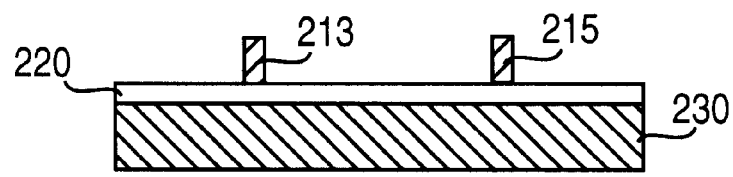

Next, the nitride spacers 253 and 255 are removed, along with the remaining spacer material 250. This step reveals the polysilicon gates 213 and 215, as shown in FIGS. 2*i*-1 and 2*i*-2. Again, the gate dielectric layer 220 is not shown in FIG. 2*i*-1 in order to reveal the underlying structures. Gates 213 and 215 are shorted together by the polysilicon 210 that remains over the isolation trenches 222 and 224. Note that since the two gates 213 and 215 are meant to operate in tandem, there is no need to remove any of the remaining polysilicon 210, and thus no need for an additional mask.

Figures 1, 2J:
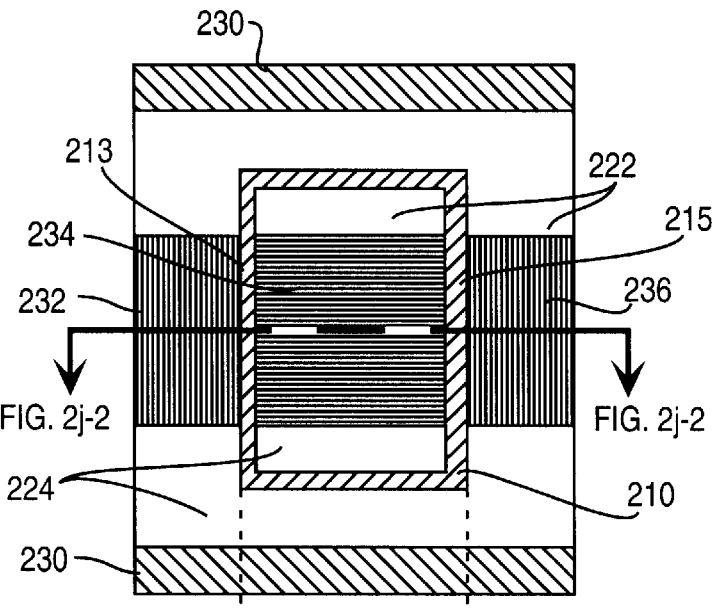
Figures 2, 2J:
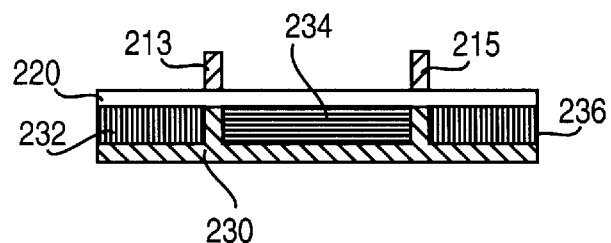

Following the formation of the gates 213 and 215, a conductive region 234 is formed in the substrate 230 between the two gates 213 and 215, as depicted in FIGS. 2*j*-1 and 2*j*-2. FIG. 2*j*-1 does not show the gate dielectric layer in order to reveal the underlying structures. The conductive region 234 allows the two gates 213 and 215 to operate in series, performing together as a single gate. The conductive region 234 is formed by heavily doping the substrate in the area between the two gates 213 and 215. Diffusion and ion implantation are two recognized methods for introducing dopants into silicon. The preferred method in this example is ion implantation. For n-channel transistors, the region 234 is preferably doped with arsenic at a dose of approximately $5 \times 10^{15}$ atoms/cm$^2$ at an energy of approximately 20 KeV. For p-channel transistors, the region 234 is preferably doped with boron at a dose of approximately $4 \times 10^{15}$ atoms/cm$^2$ at an energy of approximately 5 KeV. Other dopants, doses, and energies are possible.

The source region 232, drain region 236, and polysilicon contact 270 are fabricated using methods well known in the art.

In the discussion above in connection with FIGS. 2*c*-1 through 2*d*-2, the hard mask 241 patterning is described using a positive resist. As a result, side walls onto which the nitride spacers are to be formed are created on the sides of the hard mask mesa 241, shown in FIG. 2*d*-2. Alternatively, if a negative resist is used, a hard mask trench will result after the first masking step and the side walls will be located inside the trench. The gap between the two cascading gates will be reduced, leading to higher device performance. This alternative example embodiment is depicted in FIGS. 3*a*-1 through 3*d*-2.

Figures 1, 3A:
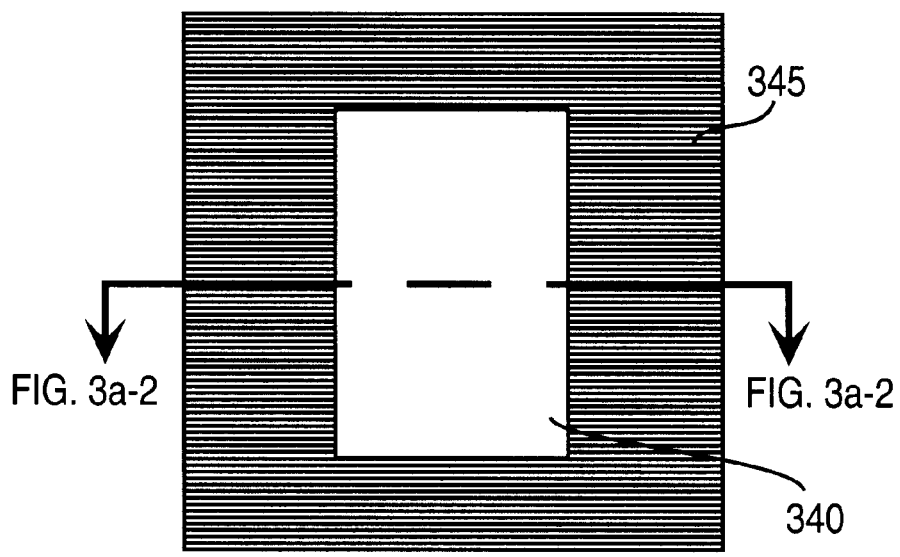
Figures 2, 3A:
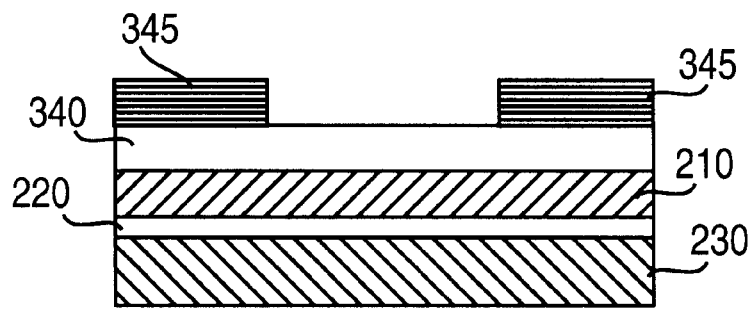
Figures 1, 3B:
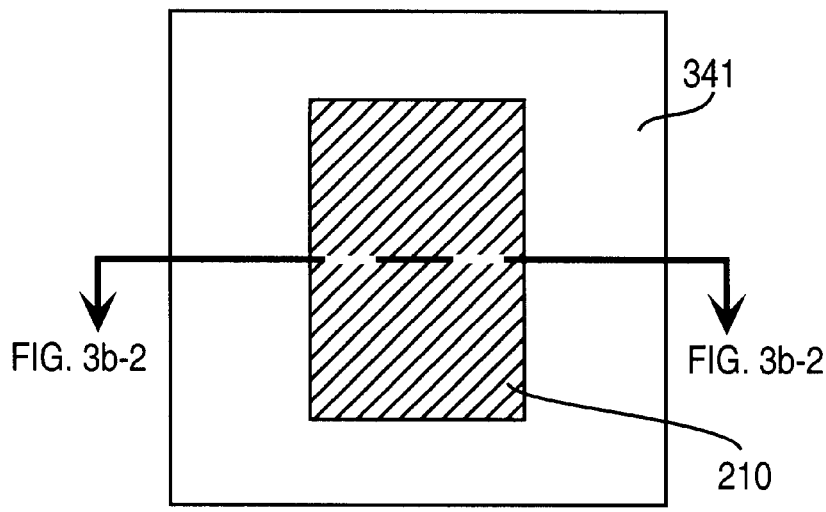
Figures 2, 3B:
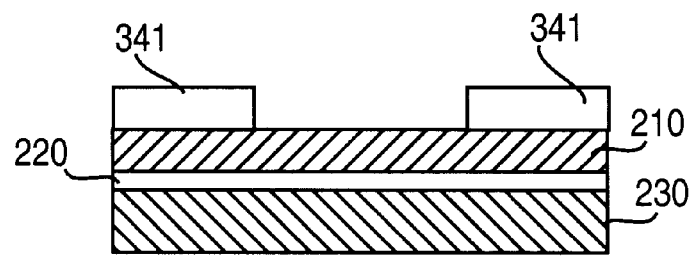

FIGS. 3a-1 and 3a-2 show a photoresist mask 345. This mask is the negative of that shown in FIGS. 2c-1 and 2c-2. The photoresist mask 345 is used to form a hard mask 341, as depicted in FIGS. 3b-1 and 3b-2. The hard mask 341 forms a trench. It is adjacent to the inside walls of the hard mask 341 that the future gate hard masks will be formed.

Figure 3C:
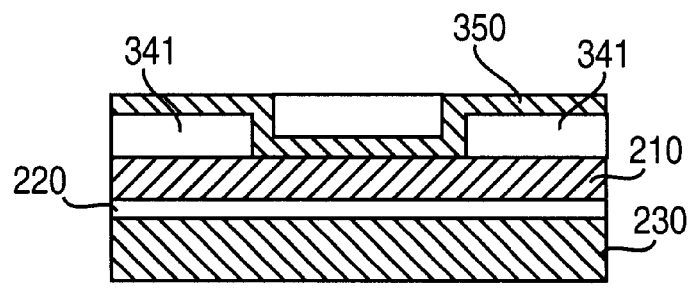
FIG. 3c is a side-view depiction of a layer of spacer material conformally deposited over the previously existing structures in accordance with the teachings of the present invention.
Figures 1, 3D:
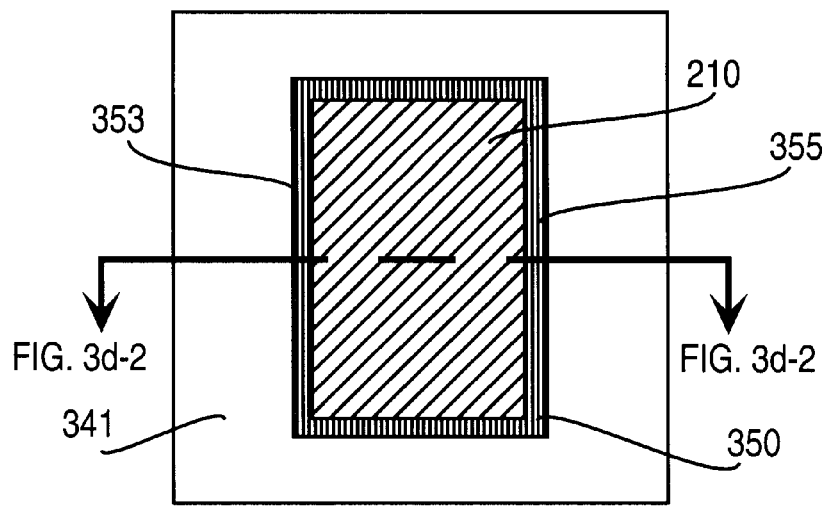
Figures 2, 3D:
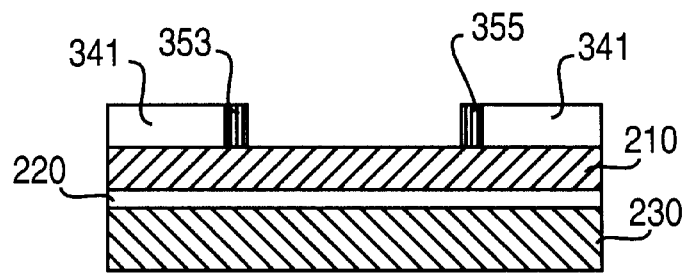

Next, a layer of spacer material 350 is formed, as shown in FIG. 3c. After the deposition of the spacer material 350, the spacer material 350 is anisotropically etched, forming spacers 353 and 355, as depicted in FIGS. 3d-1 and 3d-2. The process then reverts back to that previously discussed in connection with FIGS. 2g-1 through 2j-2.

Figure 4A:
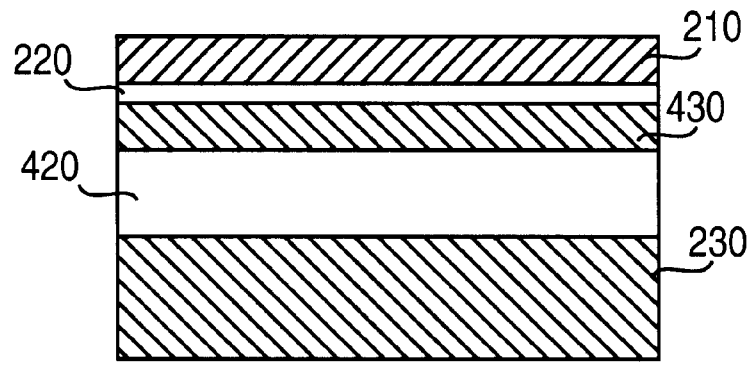
FIG. 4a is a side-view depiction of a substrate, an insulating layer, a semiconductor region, a gate dielectrically conductive material implemented in accordance with the teaching of the present invention.
Figure 4B:
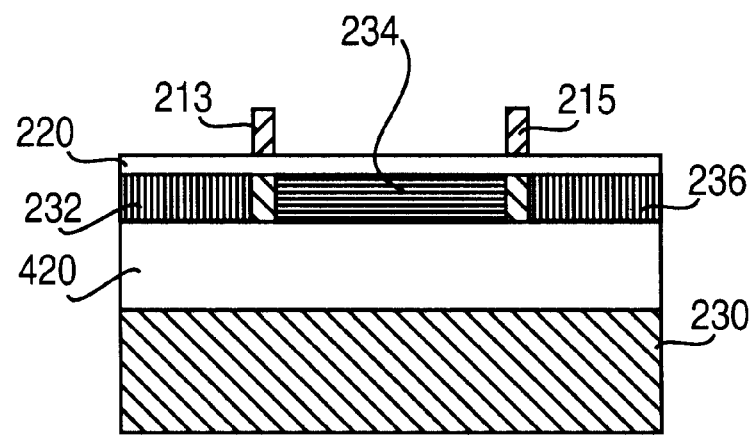
FIG. 4b is a side-view depiction of a cascading gate transistor structure including a pair of gates, a gate dielectric layer, a conductive region, a source region, and a drain region, formed over an insulating layer, implemented in accordance with the teachings of the present invention.

Another example embodiment implemented in accordance with the present invention involves including an insulating layer between the substrate and the transistor structure. This is typically referred to as silicon on insulator (SOI). The insulating layer reduces the internal capacitance of the device, which improves device performance. FIG. 4a shows a substrate 230, an insulating layer 420, a semiconductor 430, a gate dielectric layer 220, and a layer of electrically conductive material 210. In the present example, the substrate 230 comprises silicon. The insulating layer 420 comprises silicon dioxide, and has a thickness of preferably 4000 Å. The semiconductor region 430 comprises silicon, and has a thickness of preferably 1000 Å. The gate dielectric layer 220 comprises silicon dioxide, and has a thickness of preferably between 20–50 Å. The layer of electrically conductive material 210 comprises polysilicon, and has a thickness of preferably between 1000–3500 Å. The materials and methods of fabrication discussed above in connection with FIGS. 2a-1 through 2j-2 also apply to the present example. However, in the present example, the conductive region 234, the source region 232, and the drain region 236 are not formed in the substrate 230, but in the semiconductor region 430, as depicted in FIG. 4b. FIG. 4b shows the cascading gate transistor structure, comprising the gates 213 and 215, the gate dielectric layer 220, the conductive region 234, the source region 232, and the drain region 236, formed over the insulating layer 420.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded in an illustrative rather than in a restrictive sense.

What is claimed is:

1. A method of forming a cascading transistor gate, comprising the steps of:
   forming a dielectric layer on a substrate;
   forming a layer of electrically conductive material on the dielectric layer;
   forming a mask on the layer of electrically conductive material, the mask having a first edge and a second edge;
   forming a first spacer on said layer of electrically conductive material adjacent to the first edge;
   forming a second spacer on said layer of electrically conductive material adjacent to the second edge;
   removing the mask;
   etching the electrically conductive material in alignment with the first and second spacers;
   removing the first and second spacers in order to reveal a first gate and a second gate; and
   forming an electrically conductive region in the substrate between the first gate and the second gate.

2. The method of forming a cascading transistor gate of claim 1, wherein the substrate comprises silicon, and further wherein the step of forming an electrically conductive region in the substrate comprises doping the silicon with boron.

3. The method of forming a cascading transistor gate of claim 1, wherein the substrate comprises silicon, and further wherein the step of forming an electrically conductive region in the substrate comprises doping the silicon with arsenic.

4. A method of forming a cascading transistor gate, comprising the steps of:
   forming a dielectric layer on a substrate;
   forming a layer of electrically conductive material on the dielectric layer;
   forming a layer of mask material over the layer of electrically conductive material;
   patterning the layer of mask material using photolithography, the mask having a first edge and a second edge;
   forming a layer of spacer material over the mask and electrically conductive material;
   etching the spacer material to form a first spacer adjacent to the first edge and a second spacer adjacent to the second edge;
   removing the mask;
   etching the electrically conductive material in alignment with the first and second spacers;
   removing the first and second spacers in order to reveal a first gate and a second gate; and
   forming a conductive region in the substrate between the first gate and the second gate.

5. The method of forming a cascading transistor gate of claim 4, wherein the mask material comprises silicon dioxide.

6. The method of forming a cascading transistor gate of claim 4, wherein the electrically conductive material comprises polysilicon.

7. The method of forming a cascading transistor gate of claim 4, wherein the step of forming a layer of spacer material further comprises the step of performing a conformal pattern transfer layer deposition of the spacer material.

8. The method of forming a cascading transistor gate of claim 7, wherein the step of etching the spacer material is accomplished by using a reactive ion etching process.

9. The method of forming a cascading transistor gate of claim 8, wherein the spacer material comprises silicon nitride.

10. The method of forming a cascading transistor gate of claim 4, wherein the substrate comprises silicon.

11. The method of forming a cascading transistor gate of claim 10, wherein the step of forming a conductive region further comprises the step of doping the conductive region with boron.

12. The method of forming a cascading transistor gate of claim 11, wherein the step of doping the conductive region with boron is accomplished by ion implantation.

13. The method of forming a cascading transistor gate of claim 10, wherein the step of forming a conductive region further comprises the step of doping the conductive region with arsenic.

14. The method of forming a cascading transistor gate of claim 13, wherein the step of doping the conductive region with arsenic is accomplished by ion implanation.

* * * * *